(12) United States Patent
Koga et al.

(10) Patent No.: US 9,613,890 B2
(45) Date of Patent: *Apr. 4, 2017

(54) SEMICONDUCTOR DEVICE

(71) Applicant: ROHM CO., LTD., Kyoto (JP)

(72) Inventors: Akihiro Koga, Kyoto (JP); Toichi Nagahara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/192,824

(22) Filed: Jun. 24, 2016

(65) Prior Publication Data

US 2016/0307827 A1 Oct. 20, 2016

Related U.S. Application Data

(60) Continuation of application No. 14/692,902, filed on Apr. 22, 2015, now Pat. No. 9,379,047, which is a (Continued)

(30) Foreign Application Priority Data

May 15, 2009 (JP) ................................. 2009-118833

(51) Int. Cl.
*H01L 23/495* (2006.01)
*H01L 23/31* (2006.01)
(Continued)

(52) U.S. Cl.
CPC ...... *H01L 23/49541* (2013.01); *H01L 23/293* (2013.01); *H01L 23/3107* (2013.01);
(Continued)

(58) Field of Classification Search
CPC . H01L 2224/48247; H01L 2224/48091; H01L 2924/01079; H01L 2924/14; H01L 2924/01029
See application file for complete search history.

(56) References Cited

U.S. PATENT DOCUMENTS 6,504,097 B2  1/2003  Kobayashi et al.
6,627,981 B2  9/2003  Shibata
(Continued)

FOREIGN PATENT DOCUMENTS

CN      1650425 A     8/2005
CN      1832158 A     9/2006
(Continued)

*Primary Examiner* — Quoc Hoang
(74) *Attorney, Agent, or Firm* — Rabin & Berdo, P.C.

(57) ABSTRACT

A semiconductor device includes a resin package, a semiconductor chip sealed in the package and having first and second pads on a front surface. An island of the device has a projecting terminal sealed in the package, to one surface of which a back surface of the chip is bonded, and the other surface of which is partially exposed from a bottom surface of the package as a first terminal. A lead separate from the island is sealed in the package and has one surface electrically connected with the second pad, and another surface exposed from the package bottom surface as a second terminal capable of electrical connection between the second pad and outside. A mass center of the chip is away from a center of the package, the projecting terminal is as large as the lead, and solder under the device spreads to the island projecting terminal.

24 Claims, 6 Drawing Sheets

Related U.S. Application Data division of application No. 14/160,315, filed on Jan. 21, 2014, now Pat. No. 9,035,441, which is a continuation of application No. 13/320,528, filed as application No. PCT/JP2010/058101 on May 13, 2010, now Pat. No. 8,680,659.

(51) Int. Cl.
*H01L 23/00* (2006.01)
*H01L 23/498* (2006.01)
*H01L 23/29* (2006.01)

(52) U.S. Cl.
CPC .... H01L 23/3114 (2013.01); H01L 23/49503 (2013.01); H01L 23/49517 (2013.01); H01L 23/49805 (2013.01); H01L 24/49 (2013.01); *H01L 24/45* (2013.01); *H01L 24/48* (2013.01); *H01L 2224/05554* (2013.01); *H01L 2224/45144* (2013.01); *H01L 2224/48247* (2013.01); *H01L 2224/49171* (2013.01); *H01L 2924/00014* (2013.01); *H01L 2924/01005* (2013.01); *H01L 2924/01023* (2013.01); *H01L 2924/01029* (2013.01); *H01L 2924/01033* (2013.01); *H01L 2924/01079* (2013.01); *H01L 2924/01082* (2013.01); *H01L 2924/17747* (2013.01); *H01L 2924/181* (2013.01)

(56) References Cited

U.S. PATENT DOCUMENTS

| | | | |
|---|---|---|---|
| 7,170,149 B2 | 1/2007 | Shirasaka et al. | |
| 7,589,399 B2 | 9/2009 | Kohashi | |
| 7,608,482 B1 * | 10/2009 | Bayan | H01L 24/97 257/666 |
| 7,687,893 B2 | 3/2010 | Smith | |
| 8,680,659 B2 * | 3/2014 | Koga | H01L 23/3107 257/676 |
| 9,035,441 B2 * | 5/2015 | Koga | H01L 23/49805 257/676 |
| 9,379,047 B2 * | 6/2016 | Koga | H01L 23/3107 |
| 2002/0096790 A1 | 7/2002 | Kasuya | |
| 2003/0057542 A1 | 3/2003 | Frezza et al. | |
| 2005/0199987 A1 | 9/2005 | Danno et al. | |
| 2006/0185452 A1 | 8/2006 | Shirasaka et al. | |
| 2007/0052073 A1 | 3/2007 | Kohashi | |
| 2008/0284008 A1 | 11/2008 | Urushihata | |
| 2009/0032919 A1 | 2/2009 | Hiromoto et al. | |

FOREIGN PATENT DOCUMENTS

| | | |
|---|---|---|
| JP | 479444 U | 7/1992 |
| JP | 05-102205 A | 4/1993 |
| JP | 6252328 A | 9/1994 |
| JP | H07-036463 U | 7/1995 |
| JP | 200128420 A | 1/2001 |
| JP | 2001-313363 A | 11/2001 |
| JP | 2001-326314 A | 11/2001 |
| JP | 2004207764 A | 7/2004 |
| JP | 2006-287073 A | 10/2006 |
| JP | 2007-059786 A | 3/2007 |
| JP | 2007-095788 A | 4/2007 |
| JP | 2008270302 A | 11/2008 |
| WO | WO-2006/112332 A1 | 10/2006 |

* cited by examiner

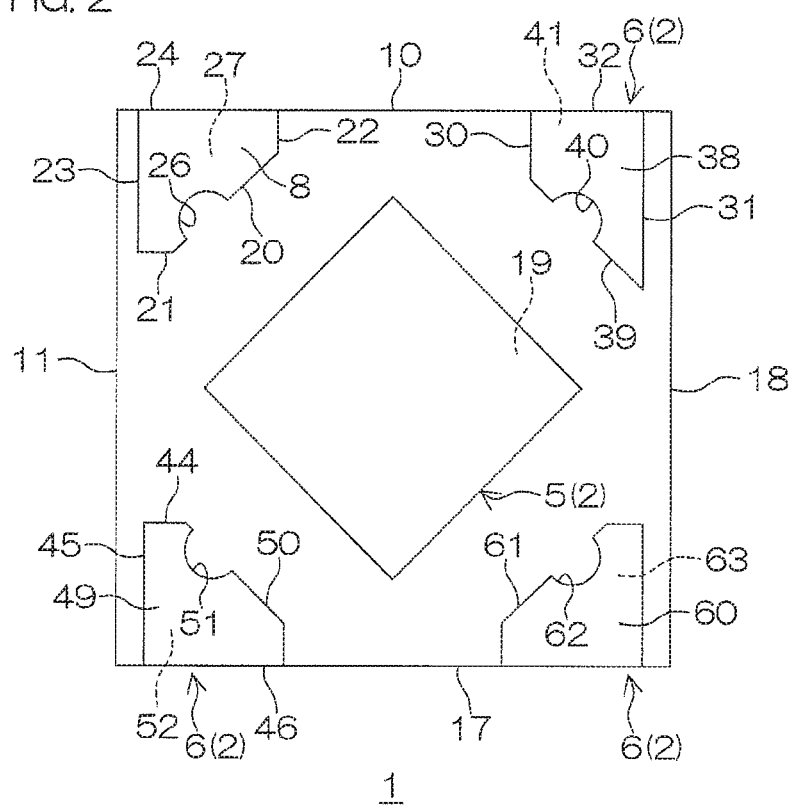

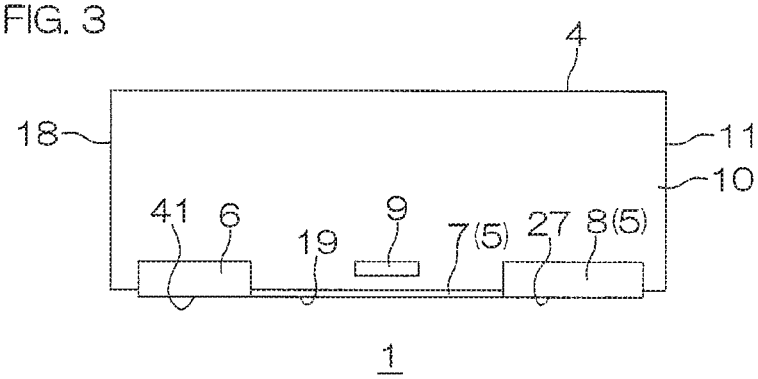
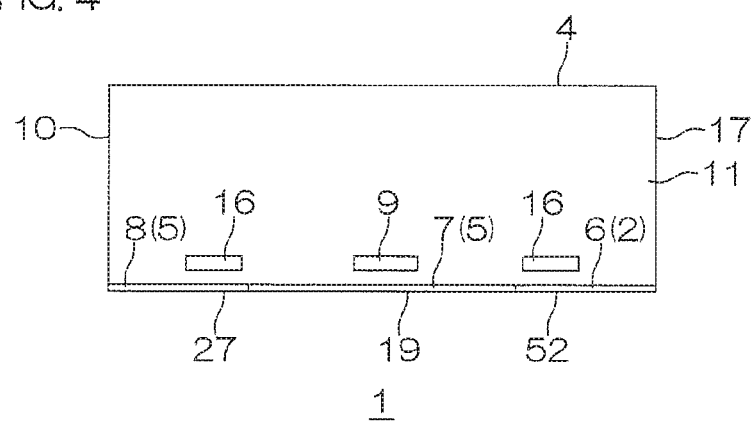

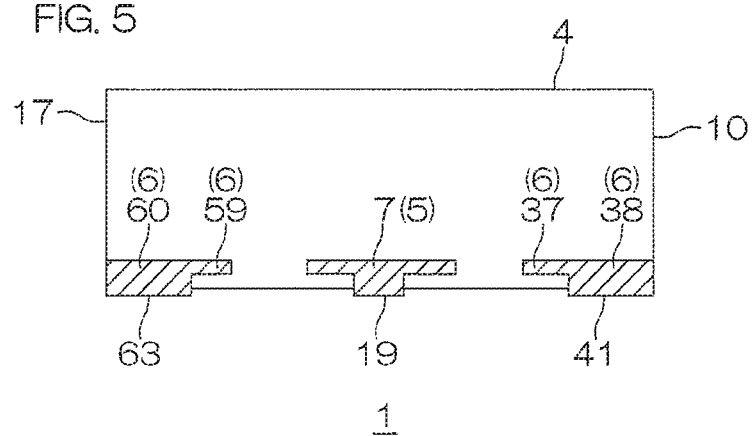
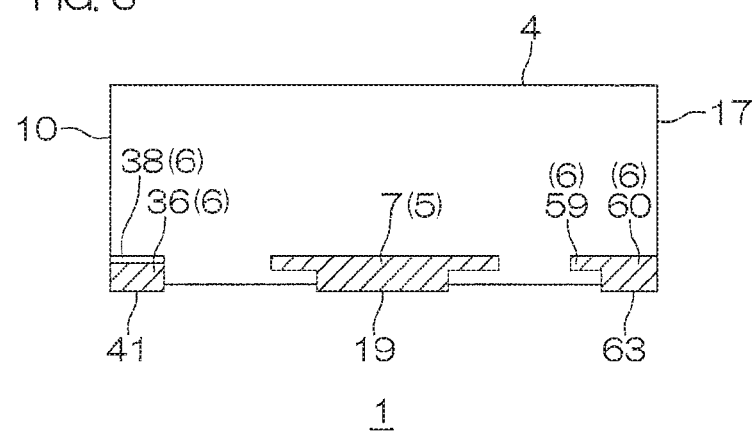

SEMICONDUCTOR DEVICE

CROSS-REFERENCE

This Application is a continuation of Ser. No. 14/692,902, filed on Apr. 22, 2015, now allowed on Mar. 1, 2016, which is a division of U.S. application Ser. No. 14/160,315, filed on Jan. 21, 2014 (now U.S. Pat. No. 9,035,441, issued on May 19, 2015), which is a continuation of Ser. No. 13/320,528, filed on Dec. 9, 2011 (now U.S. Pat. No. 8,680,659, issued on Mar. 25, 2014), which is, in turn, a national stage of PCT application number PCT/JP2010/058101, filed on May 13, 2010. Furthermore, this application claims priority under 35 U.S.C. §119 to Japanese Patent Application No. 2009-118833, filed on May 15, 2009. Each of identified applications is incorporated in its entirety herein by reference.

TECHNICAL FIELD

The present invention relates to a surface mounted semiconductor device.

BACKGROUND ART

As a surface mounted package, a so-called non-lead package for which extension of leads from a resin package is eliminated, and leads (outer leads) are exposed on a lower surface of the resin package is known.

FIG. 7 is a plan view of a semiconductor device using a non-lead package, and transparently shows, by solid lines, members sealed in a resin package.

The semiconductor device 101 using a non-lead package has a structure for which a semiconductor chip 103 is bonded to a lead frame 102, and these are sealed by a resin package 104. The resin package 104 is formed in a regular square shape in a plan view.

The lead frame 102 includes an island 105 and four leads 106 separated from the island 105. The island 105 is, in a plan view, formed in a regular square shape whose center overlaps the center of the resin package 104 and whose sides are parallel with the sides of the resin package 104. The four leads 106 are each disposed so as to be opposed to each corner portion of the island 105 in a direction along a diagonal of the island 105. Each lead 106 is, in a plan view, formed in a regular square shape whose sides are parallel with the sides of the resin package 104. Lower surfaces of the island 105 and each lead 106 are, as terminals for electrical connection with a substrate on which the semiconductor device 101 is mounted, exposed on a back surface of the resin package 104.

The semiconductor chip 103 shows a substantially regular square shape in a plan view, and is disposed on the island 105 so that its sides are parallel with the sides of the island 105. A back surface of the semiconductor chip 103 is bonded to the island 105 via a conductive bonding material. At four corner portions of a front surface of the semiconductor chip 103, pads 107 are formed by exposing a part of internal wiring. Between each pad 107 and the lead 106 opposed to the corner portion of the semiconductor chip 103 at which the pad 107 is formed, a wire 108 is stretched.

CITATION LIST

Patent Literature

Patent Document 1: Japanese Published Unexamined Patent Application No. 2007-95788

SUMMARY OF INVENTION

Technical Problem

For satisfactorily stretching the wire 108 between the lead 106 and the pad 107, it is necessary to have an interval of a fixed interval (for example, 310 μm) or more therebetween. Accordingly, the lead 106 cannot be made closer than a fixed distance to the island 105, and the plane area of the resin package 104 (mounting area of the semiconductor device 101) is relatively large.

Therefore, considered is a configuration of, as shown in FIG. 8, forming an island 105 rotated by 45° from the state shown in FIG. 7 so that the diagonals of the island 105 become perpendicular to the diagonals of the resin package 104 in a plan view, and disposing at parts opposed to the four sides of the island 105, respectively, substantially triangular-shaped leads 106 two sides of each of which are parallel with two sides of the resin package 104.

However, with this configuration, another problem that the accuracy in recognition of the pad 107 for formation of the wire 108 degrades occurs. Usually, the position of the pad 107 of the semiconductor chip 103 is recognized based on an angle created by a straight line to connect two alignment marks M provided at an upper left part and a lower right part of the figure in the front surface of the semiconductor chip 103 and a direction parallel to one side of the resin package 104. Therefore, when the island 105 is formed rotated by 45° from the state shown in FIG. 7, the two alignment marks M are formed separated in a direction parallel to one side of the semiconductor chip 103. Accordingly, the interval between the two alignment marks M cannot be secured large, and the accuracy in recognition of the position of the pad 107 on the semiconductor chip 103 degrades. Consequently, the yield of wire bonding of the semiconductor chip 103 on the island 105 is reduced.

An object of the present invention is to provide a semiconductor device which allows a reduction in the plane area (mounting area) of a resin package, while allowing satisfactory stretching of a wire between the pad and lead.

Solution to Problem

A semiconductor device according to one aspect of the present invention for achieving the object described above includes a resin package, a semiconductor chip sealed in the resin package, and having first and second pads on a front surface, a lead integrated island sealed in the resin package, to one surface of which a back surface of the semiconductor chip is bonded, and the other surface of an opposite side to the one surface of which is partially exposed from a bottom surface of the resin package as a first pad connecting terminal capable of electrical connection between the first pad and outside and a back connecting terminal capable of electrical connection between the back surface of the semiconductor chip and outside separately from each other, and a lead formed separately from the lead integrated island, sealed in the resin package, one surface of which is connected with the second pad by a wire, and the other surface of an opposite side to the one surface of which is exposed from a bottom surface of the resin package as a second pad connecting terminal capable of electrical connection between the second pad and outside, and the semiconductor chip is, on the one surface of the lead integrated island, disposed at a position one-sided to the first pad connecting terminal side, and the first pad and the one surface of the lead integrated island are connected by a wire.

As a result of the semiconductor chip being disposed at a position one-sided to the first pad connecting terminal side on the one surface of the lead integrated island, an interval where a wire can be satisfactorily stretched (interval where a wire can normally loop) is secured between the first pad on the front surface of the semiconductor chip and a bonding position of a wire on the one surface of the lead integrated island. Therefore, the wire can be satisfactorily stretched between the bonding position and the first pad. As a result of the first pad and the one surface of the lead integrated island being connected by the wire, electrical connection between the first pad and the first pad connecting terminal can be achieved.

Moreover, since the semiconductor chip is disposed at a position one-sided to the first pad connecting terminal side on the one surface of the lead integrated island, even when the lead is disposed close to the lead integrated island, an interval where a wire can be satisfactorily stretched is secured between the second pad on the front surface of the semiconductor chip and the lead. Therefore, the wire can be satisfactorily stretched between the second pad and the lead. As a result of the second pad and the lead being connected by the wire, electrical connection between the second pad and the second pad connecting terminal can be achieved.

Accordingly, as a result of the lead being disposed close to the lead integrated island while electrical connections between the first and second pads and the first and second pad connecting terminals can be achieved, the plane area (mounting area) of the resin package can be reduced.

Usually, for fixing the semiconductor chip to the lead integrated island, a conductive bonding agent paste is interposed between the back surface of the semiconductor chip and the one surface of the lead integrated island. Since the conductive bonding agent is a paste, the conductive bonding agent may seep out between the back surface of the semiconductor chip and the one surface of the lead integrated island when the back surface of the semiconductor chip is bonded to the one surface of the lead integrated island.

Therefore, it is preferable that, in the one surface of the lead integrated island, a groove is formed between a bonding position of the semiconductor chip and a connecting position of the wire.

Accordingly, even when the conductive bonding agent seeps out between the back surface of the semiconductor chip and the one surface of the lead integrated island, the groove can stem the seeping of the bonding agent. Therefore, the conductive bonding agent can be prevented from reaching the connecting position of the wire on the one surface of the lead integrated island, so that a short circuit due to contact between the conductive bonding agent and the wire can be prevented.

Moreover, it is preferable that the first and second pads are, in the front surface of the semiconductor chip, disposed at positions one-sided to an opposite side to the first pad connecting terminal side.

Accordingly, even when the semiconductor chip is disposed at a position one-sided to the first pad connecting terminal side on the one surface of the lead integrated island, the intervals between the first and second pads and the lead can be prevented from becoming excessively large. Therefore, wires to be stretched therebetween can be prevented from becoming excessively long. Consequently, the wires can be satisfactorily stretched, and an increase in the cost (material cost) of the wires can be suppressed.

The semiconductor chip may be disposed so that its part overlaps the first pad connecting terminal in a plan view. In other words, the semiconductor chip may be increased in size to the first pad connecting terminal side to such an extent that a part of the semiconductor chip overlaps the first pad connecting terminal in a plan view.

Even when the semiconductor chip is increased in size to the first pad connecting terminal side, the interval between the semiconductor chip and the lead is unchanged, so that it is not necessary to keep the lead away from the lead integrated island. Therefore, a large-sized semiconductor chip can be realized without increasing the plane area of the resin package, and the wire can be satisfactorily stretched between the second pad and the lead.

The resin package may be formed in a square shape in a plan view. In addition, three leads may be provided, and in this case, the first pad connecting terminal may be disposed at one of the corner portions of the bottom surface of the resin package, and the second pad connecting terminals may be disposed one each at the other corner portions of the bottom surface of the resin package.

Moreover, the semiconductor chip may have a protruding part protruding from the lead integrated island in a plan view. In this case, it is preferable that, on the one surface of the lead closest to the projecting part, a step for which a part opposed to the projecting portion is one-step lower is formed.

Accordingly, contact of the protruding part with the one surface of the lead can be reliably prevented.

Moreover, when the resin package is formed in a square shape in a plan view, it is preferable that the semiconductor chip is formed in a square shape in a plan view, and disposed so that its side surfaces are parallel with side surfaces of the resin package.

Two alignment marks to recognize the positions of the pads of the semiconductor chip on the lead integrated island can be formed on a diagonal of the front surface of the semiconductor chip. Therefore, a large interval can be secured between the two alignment marks, so that the positions of the pads of the semiconductor chip can be recognized with high accuracy. Consequently, the positions of the pads of the semiconductor chip on the lead integrated island can be positioned with high accuracy.

Moreover, when the semiconductor chip is formed in a square shape in a plan view, it is preferable that, in the lead integrated island, a cut-away portion having a straight part to serve as a reference when positioning the semiconductor chip with respect to the lead integrated island is formed by cutting away the lead integrated island from its side surface.

The semiconductor chip can be easily positioned, with reference to the straight part formed in the lead integrated island, on the one surface of the lead integrated island, in a direction perpendicular to the straight part.

Further, in the semiconductor device, it is more preferable that two cut-away portions are formed in the lead integrated island, and the straight parts of the cut-away portions extend in directions perpendicular to each other.

The semiconductor chip can be easily positioned, with reference to the two straight parts extending in directions perpendicular to each other, on the one surface of the lead integrated island, in two directions perpendicular to the straight parts.

Furthermore, in the semiconductor device, as a result of the semiconductor chip being disposed on one surface of the lead integrated island so that an end edge of the semiconductor chip overlaps the straight part, the semiconductor chip can be further easily positioned.

Moreover, in the semiconductor device, it is preferable that a recess portion that is recessed from the other surface side and opened at its side surface is formed in the lead, and the resin package enters in the recess portion.

As a result of the resin package entering into the recess portion, the part of the lead where the recess portion is formed is sandwiched from both sides in its thickness direction by the resin package. Thus, the lead can be prevented from dropping out of the resin package.

Moreover, an external form of the resin package may be a hexahedron having a regular square shape in a plan view, and in that case, it is preferable that the lead integrated island includes an island part having a side inclined at 45° with respect to any of the sides of the resin package in a plan view.

Moreover, the lead integrated island may have a suspending portion extending from the island part to a side surface of the resin package, and in that case, it is preferable that an end face of the suspending portion is, on a side surface of the resin package, exposed flush with the side surface.

Moreover, it is preferable that the lead integrated island includes a lead part joined to one side of the island part, and a central portion of the island part and a corner portion of the lead part are formed thicker than a remaining part other than these.

The back connecting terminal may show a square shape having four sides inclined at 45° with respect to the sides of the resin package.

Moreover, the step is formed lower by 0.03 mm to 0.05 mm than the one surface of the lead.

A semiconductor device according to another aspect of the present invention includes a resin package, a semiconductor chip sealed in the resin package, and having a pad on a front surface, a lead integrated island sealed in the resin package, to one surface of which a back surface of the semiconductor chip is bonded, and the other surface of an opposite side to the one surface of which is partially exposed from a bottom surface of the resin package as a connecting terminal and a back connecting terminal capable of electrical connection between the back surface of the semiconductor chip and outside separately from each other, and a lead formed separately from the lead integrated island, sealed in the resin package, one surface of which is connected with the pad by a wire, and the other surface of an opposite side to the one surface of which is exposed from a bottom surface of the resin package as a pad connecting terminal capable of electrical connection between the pad and outside, and the semiconductor chip is, on the one surface of the lead integrated island, disposed at a position one-sided to the connecting terminal side.

Since the semiconductor chip is disposed at a position one-sided to the connecting terminal side on the one surface of the lead integrated island, even when the lead is disposed close to the lead integrated island, an interval where a wire can be satisfactorily stretched (interval where a wire can normally loop) is secured between the pad on the front surface of the semiconductor chip and the lead. Therefore, as a result of the lead being disposed close to the lead integrated island while the wire can be satisfactorily stretched between the pad and the lead, the plane area (mounting area) of the resin package can be reduced.

BRIEF DESCRIPTION OF DRAWINGS

FIG. 2 is a plan view of the semiconductor device shown in FIG. 1, and transparently shows, by solid lines, parts of a lead frame exposed from a bottom surface of the resin package.

FIG. 3 is a side view of the semiconductor device when viewed from the direction of arrow A shown in FIG. 1.

FIG. 4 is a side view of the semiconductor device when viewed from the direction of arrow B shown in FIG. 1.

FIG. 5 is a sectional view taken along the cut line V-V of the semiconductor device shown in FIG. 1.

FIG. 6 is a sectional view taken along the cut line VI-VI of the semiconductor device shown in FIG. 1.

DESCRIPTION OF EMBODIMENTS

Figure 1:
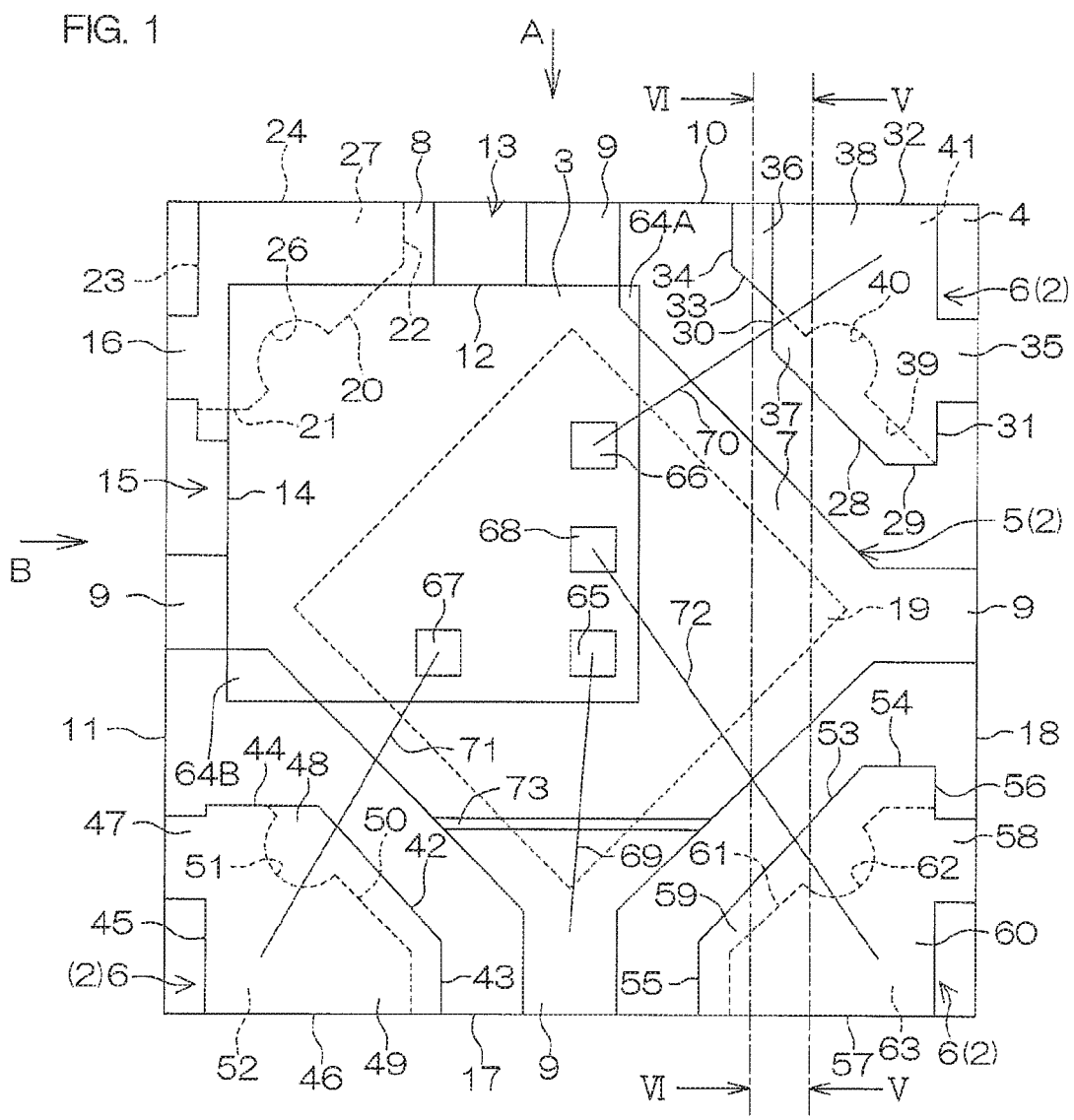
FIG. 1 is a plan view of a semiconductor device according to an embodiment of the present invention, and transparently shows, by solid lines, members sealed in a resin package, and transparently shows, by broken lines, parts of a lead frame exposed from a bottom surface of the resin package.
Figure 7:
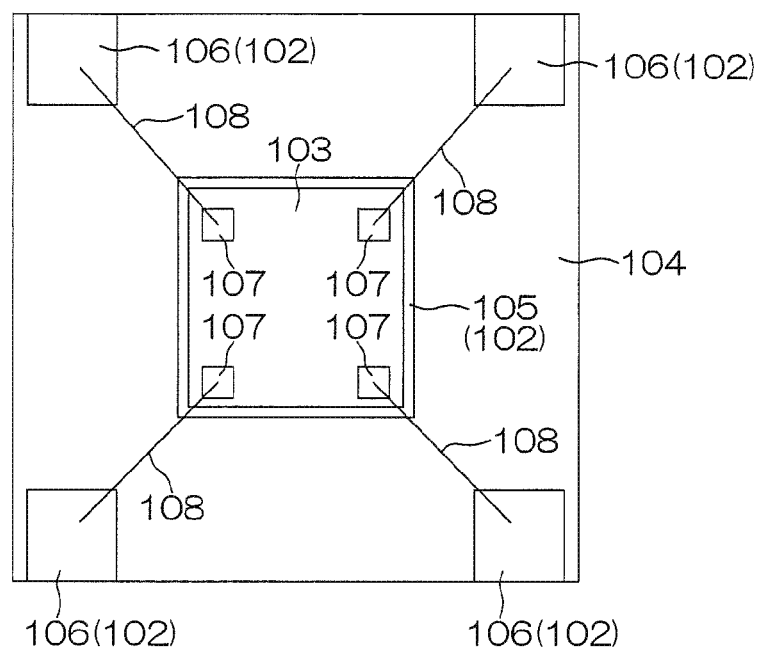
FIG. 7 is a plan view of a conventional semiconductor device, and transparently shows, by solid lines, members sealed in a resin package.
Figure 8:
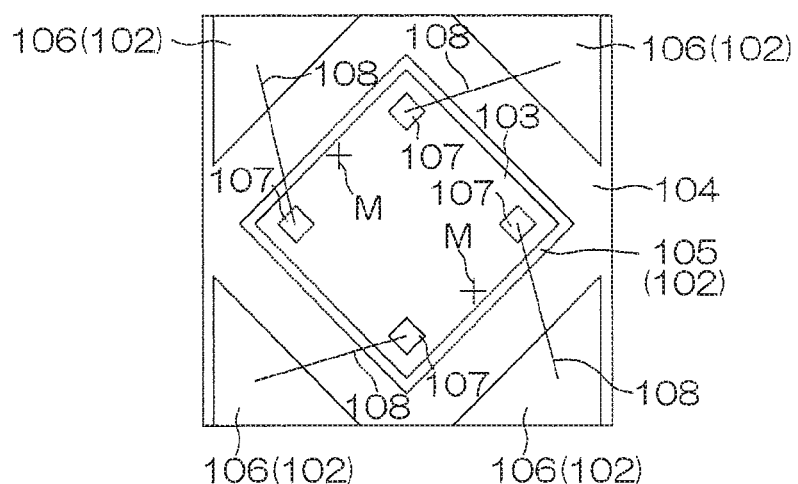
FIG. 8 is a plan view of another conventional semiconductor device, and transparently shows, by solid lines, members sealed in a resin package.

Hereinafter, embodiments of the present invention will be described in detail with reference to the accompanying drawings. FIG. 1 and FIG. 2 are plan views of a semiconductor device according to an embodiment of the present invention. FIG. 1 transparently shows members sealed in a resin package by solid lines. Also, FIG. 1 transparently shows parts of a lead frame exposed from a bottom surface of the resin package by broken lines. FIG. 2 transparently shows only parts of a lead frame exposed from a bottom surface of the resin package by solid lines. FIG. 3 is a side view of the semiconductor device when viewed from the direction of arrow A shown in FIG. 1. FIG. 4 is a side view of the semiconductor device when viewed from the direction of arrow B shown in FIG. 1. FIG. 5 is a sectional view taken along the cut line V-V of the semiconductor device shown in FIG. 1. FIG. 6 is a sectional view taken along the cut line VI-VI of the semiconductor device shown in FIG. 1.

The semiconductor device 1 has a structure for which a semiconductor chip 3 is bonded to a lead frame 2, and these are sealed by a resin package 4. The external form of the semiconductor device 1 (resin package 4) shows a flat rectangular parallelepiped shape (in the present embodiment, a hexahedron having a regular square shape in a plan view).

The lead frame 2 is formed by stamping out a thin metal plate (for example, a thin copper plate), and includes a lead integrated island 5 and three leads 6 disposed around the lead integrated island 5.

The lead integrated island 5 has a shape for which a projecting terminal or lead part 8 having a substantially triangular shape in a plan view is joined to one side of an island part 7 that is in a square shape having four sides inclined at 45° with respect to the sides of the resin package 4 in a plan view.

The island part 7 is disposed in a central portion of the resin package 4 in a plan view. Suspending portions 9 having square shapes in a plan view extend from corner portions of the island part 7 toward side surfaces of the resin package 4 to which these corner portions are opposed. An end face of each suspending portion 9 is, on the side surface of the resin package 4, exposed flush with this side surface.

The lead part 8 is disposed at one corner portion of the resin package 4 in a plan view. The lead part 8 has a side surface that is, on one side surface (hereinafter, this side surface is called a "first side surface 10") of the resin package 4, exposed flush with this first side surface 10 and a side surface that is parallel at an interval with another side surface (hereinafter, this side surface is called a "second side surface 11") of the resin package 4 perpendicular to the first side surface 10. In the lead part 8, by cutting away in a square shape from the side surface exposed on the first side surface 10, a first cut-away portion 13 having a straight part 12 parallel to the first side surface 10 is formed adjacent to the suspending portion 9 whose end face is exposed on the first side surface 10. Moreover, in the lead part 8, by cutting away in a square shape from the side surface parallel to the second side surface 11, a second cut-away portion 15 having a straight part 14 parallel to the second side surface 11 is formed adjacent to the suspending portion 9 whose end face is exposed on the second side surface 11. Further, a suspending portion 16 having a square shape in a plan view extends from the side surface of the lead part 8 parallel to the second side surface 11 toward the second side surface 11. An end face of the suspending portion 16 is, on the second side surface 11, exposed flush with the second side surface 11.

In the following, of the four side surfaces of the resin package 4, a side surface that is parallel to the first side surface 10 and perpendicular to the second side surface is called a "third side surface 17," and a side surface that is parallel to the second side surface 11 and perpendicular to the first side surface 10 and the third side surface 17 is called a "fourth side surface 18."

In the lead integrated island 5, a central portion of the island part 7 and a corner portion of the lead part 8 are formed thicker than a remaining part other than those. In addition, a lower surface of the central portion of the island part 7 formed thick shows a square shape having four sides inclined at 45° with respect to the sides of the resin package 4, and is, on a back surface of the resin package 4, exposed as a back connecting terminal 19. A lower surface of the corner portion of the lead part 8 formed thick has, in a plan view, a shape having a side 20 extending almost parallel to one side of the lower surface of the central portion of the island part 7, sides 21, 22 extending from both end portions of the side 20 parallel to the first side surface 10 and the second side surface 11, respectively, a side 23 extending from an end portion of the side 21 parallel to the second side surface 11, and a side 24 extending on the first side surface 10 from which a semicircular shape opened at the side 20 is cut away. The part where the semicircular shape is cut away is formed as a recess portion 26 that is recessed from the lower surface of the corner portion of the lead part 8. In the recess portion 26, the resin package 4 enters. The lower surface of the corner portion of the lead part 8 is, on the back surface of the resin package 4, exposed as a pad connecting terminal 27.

The three leads 6 are, in a plan view, disposed at three corner portions of the four corner portions of the resin package 4 excluding the corner portion at which the lead part 8 is disposed.

The lead 6 (hereinafter, referred to as a "first lead 6," except when the three leads 6 are collectively referred to) disposed at the corner portion created by the first side surface 10 and the fourth side surface 18 of the resin package 4 shows, in a plan view, a shape having a side 28 extending almost parallel to one side of the lower surface of the central portion of the island part 7, sides 29, 30 extending from both end portions of the side 28 parallel to the first side surface 10 and the fourth side surface 18, respectively, a side 31 extending from an end portion of the side 29 parallel to the fourth side surface 18, a side 32 extending on the first side surface 10, a side 33 extending from a halfway portion of the side 30 in a direction almost parallel to the side 28, and a side 34 extending from an end portion of the side 33 parallel to the fourth side surface 18.

A side surface that forms the side 32 of the first lead 6 is, on the first side surface 10 of the resin package 4, exposed flush with the first side surface 10. A side surface that forms the side 31 of the first lead 6 extends parallel at an interval with respect to the fourth side surface 18 of the resin package 4. From this side surface toward the fourth side surface 18, a suspending portion 35 having a square shape in a plan view extends. An end face of the suspending portion 35 is, on the fourth side surface 18, exposed flush with the fourth side surface 18.

In the first lead 6, a trapezoidal part 36 surrounded by the sides 30, 32 to 34 and a predetermined-width part 37 along the side 28 are formed thinner than a remaining part 38 other than these. An upper surface of the trapezoidal part 36 is formed lower by one step (lower by, for example, 0.03 mm to 0.05 mm) than upper surfaces of the parts 37, 38. Accordingly, the trapezoidal part 36 is formed thinnest in the first lead 6. The part 38 formed thickest has a side surface 39 that is disposed on the same straight line as with the side 33, and in a lower surface of the part 38, a recess portion 40 in a semicircular shape opened at the side surface 39 is formed. In the recess portion 40, the resin package 4 enters. The lower surface of the part 38 is, on the back surface of the resin package 4, exposed as a pad connecting terminal 41.

The lead 6 (hereinafter, referred to as a "second lead 6," except when the three leads 6 are collectively referred to) disposed at the corner portion created by the second side surface 11 and the third side surface 17 of the resin package 4 shows, in a plan view, a shape having a side 42 extending almost parallel to one side of the lower surface of the central portion of the island part 7, sides 43, 44 extending from both end portions of the side 42 parallel to the second side surface 11 and the third side surface 17, respectively, a side 45 extending from an end portion of the side 44 parallel to the second side surface 11, and a side 46 extending on the third side surface 17.

A side surface that forms the side 46 of the second lead 6 is, on the third side surface 17 of the resin package 4, exposed flush with the third side surface 17. A side surface that forms the side 45 of the second lead 6 extends parallel at an interval with respect to the second side surface 11 of the resin package 4. From this side surface toward the second side surface 11, a suspending portion 47 having a square shape in a plan view extends. An end face of the suspending portion 47 is, on the second side surface 11, exposed flush with the second side surface 11.

In the second lead 6, a predetermined-width part 48 along the sides 42, 43 is formed thinner than a remaining part 49 other than this. The part 49 formed relatively thick has a side surface 50 that is disposed on a straight line almost parallel to the side 42, and in a lower surface of the part 49, a recess portion 51 in a semicircular shape opened at the side surface 50 is formed. In the recess portion 51, the resin package 4 enters. The lower surface of the part 49 is, on the back surface of the resin package 4, exposed as a pad connecting terminal 52.

The lead 6 (hereinafter, referred to as a "third lead 6," except when the three leads 6 are collectively referred to) disposed at the corner portion created by the third side surface 17 and the fourth side surface 18 of the resin package 4 shows, in a plan view, a shape having a side 53 almost parallel to one side of the lower surface of the central portion of the island part 7, sides 54, 55 extending from both end portions of the side 53 parallel to the third side surface 17 and the fourth side surface 18, respectively, a side 56 extending from an end portion of the side 54 parallel to the fourth side surface 18, and a side 57 extending on the third side surface 17.

A side surface that forms the side 57 of the third lead 6 is, on the third side surface 17 of the resin package 4, exposed flush with the third side surface 17. A side surface that forms the side 45 of the third lead 6 extends parallel at an interval with respect to the fourth side surface 18 of the resin package 4. From this side surface toward the fourth side surface 18, a suspending portion 48 having a square shape in a plan view extends. An end face of the suspending portion 58 is, on the fourth side surface 18, exposed flush with the fourth side surface 18.

In the third lead 6, a predetermined-width part 59 along the sides 53 to 55 is formed thinner than a remaining part 60 other than this. The part 60 formed relatively thick has a side surface 61 that is disposed on a straight line almost parallel to the side 53, and in a lower surface of the part 60, a recess portion 62 in a semicircular shape opened at the side surface 61 is formed. The lower surface of the part 60 is, on the back surface of the resin package 4, exposed as a pad connecting terminal 63.

The large and small thicknesses in the lead integrated island 5 and the leads 6 can be formed by chemical etching or crushing.

The semiconductor chip 3 is, with its front surface (device forming surface) on which functional elements are formed facing upward, bonded (die-bonded) at its back surface to an upper surface of the lead integrated island 5 via a conductive bonding agent paste or solder. The semiconductor chip 3 is formed in a flat rectangular parallelepiped shape (in the present embodiment, a hexahedron having a regular square shape in a plan view), and is, in a plan view, with its two perpendicular sides being along the straight part 12 of the first cut-away portion 13 and the straight part 14 of the second cut-away portion 15, disposed at a position one-sided to the pad connecting terminal 27 side in the upper surface of the lead integrated island 5. The semiconductor chip 3 protrudes from the lead integrated island 5 at its two corner portions 64A, 64B closest to the second lead 6 and the third lead 6, respectively.

On the front surface of the semiconductor chip 3, four first to fourth pads 65 to 68 are formed at positions one-sided to the third lead 6 side by exposing a part of a wiring layer from a surface protective film. In the present embodiment, the first pad 65 is disposed at the corner portion on the front surface of the semiconductor chip 3 closest to the third lead 6. The second pad 66 is disposed at a position with an interval kept in a direction that is parallel with the fourth side surface 18 with respect to the first pad 65. The third pad 67 is disposed at a position with an interval kept in a direction that is parallel with the third side surface 17 with respect to the first pad 65. The fourth pad 68 is disposed between the first pad 65 and the second pad 66 with intervals kept with these.

Between the first pad 65 and an upper surface of the suspending portion 9 of the lead integrated island 5 that is disposed between the second lead 6 and the third lead 6, a wire 69 made of a thin gold wire is stretched. Accordingly, the first pad 65 is electrically connected with the lead integrated island 5, and is electrically connected with the pad connecting terminal 27 formed by its lower surface.

Between the second pad 66 and the upper surface of the part 38 of the first lead 6, a wire 70 made of a thin gold wire is stretched. Accordingly, the second pad 66 is electrically connected with the first lead 6, and is electrically connected with the pad connecting terminal 41 formed by its lower surface.

Between the third pad 67 and an upper surface of the part 49 of the second lead 6, a wire 71 made of a thin gold wire is stretched. Accordingly, the third pad 67 is electrically connected with the second lead 6, and is electrically connected with the pad connecting terminal 52 formed by its lower surface.

Between the fourth pad 68 and an upper surface of the part 60 of the third lead 6, a wire 72 made of a thin gold wire is stretched. Accordingly, the fourth pad 68 is electrically connected with the third lead 6, and is electrically connected with the pad connecting terminal 63 formed by its lower surface.

In the present embodiment, as shown in FIG. 1, the three leads 6 are, in a plan view, disposed at the three corner portions of the four corner portions of the resin package 4 excluding the corner portion at which the lead part 8 is disposed. In addition, from the first to fourth pads 65 to 68 of the semiconductor chip 3 disposed one-sided to the remaining corner portion of the resin package 4, the wires 69 to 72 extend to the three leads 6 and the suspending portion 9 between the second and third leads 6. Accordingly, in the resin package 4, when the resin package 4 is divided into two isosceles triangles by a diagonal extending in an opposing direction between the first lead 6 and the second lead 6, bonding is applied in a one-sided manner to the side where the third lead 6 is disposed (opposite side to the side where the lead part 8 is disposed).

On an upper surface of the island part 7 of the lead integrated island 5, a linear groove 73 extending parallel to the first side surface 10 of the resin package 4 is formed between the bonding position of the semiconductor chip 3 and the connecting position of the wire 69.

As in the above, the back connecting terminal 19 and the pad connecting terminals 27, 41, 52, 63 are exposed on the back surface of the resin package 4. Therefore, the semiconductor device 1 can be surface-mounted on a wiring board.

As a result of the semiconductor chip 3 being disposed at a position one-sided to the pad connecting terminal 27 side in the upper surface of the lead integrated island 5, an interval where the wire 69 can be satisfactorily stretched (interval where a wire can normally loop) is secured between the first pad 65 on the front surface of the semiconductor chip 3 and the upper surface of the suspending portion 9 of the lead integrated island 5. Therefore, the wire 69 can be satisfactorily stretched between the first pad 65 and the suspending portion 9. As a result of the first pad 65 and the upper surface of the lead integrated island 5 being connected by the wire 69, electrical connection between the first pad 65 and the pad connecting terminal 27 can be achieved.

Moreover, since the semiconductor chip 3 is disposed at a position one-sided to the pad connecting terminal 27 side on one surface of the lead integrated island 5, even when the leads 6 are disposed close to the lead integrated island 5, intervals where the wires 70 to 72 can be satisfactorily stretched are secured between the second to fourth pads 66 to 68 on the front surface of the semiconductor chip and the leads 6, respectively. Therefore, the wires 70 to 72 can be satisfactorily stretched between the second to fourth pads 66 to 68 and the leads 6, respectively. As a result of the second to fourth pads 66 to 68 and the leads 6 being connected by the wires 70 to 72, respectively, electrical connection between the second to fourth pads 66 to 68 and the pad connecting terminals 41, 52, 63 of the lower surfaces of the leads 6 can be achieved.

Accordingly, as a result of the leads 6 being disposed close to the lead integrated island 5 while electrical connection between the first to fourth pads 65 to 68 and the pad connecting terminals 27, 41, 52, 63 can be achieved, the plane area (mounting area) of the resin package 4 can be reduced.

Moreover, since the groove 73 is formed, in the upper surface of the lead integrated island 5, between the bonding position of the semiconductor chip 3 and the connecting position of the wire 69, even when the conductive bonding agent seeps out between the back surface of the semiconductor chip 3 and the upper surface of the lead integrated island 5, the groove 73 can stem the seeping of the bonding agent. Therefore, the conductive bonding agent can be prevented from reaching the connecting position of the wire 69 of the upper surface of the lead integrated island 5, so that a short circuit due to contact between the conductive bonding agent and the wire 69 can be prevented.

Moreover, the first to fourth pads 65 to 68 are disposed, in the front surface of the semiconductor chip 3, at positions one-sided to an opposite side to the pad connecting terminal 27 side, that is, the pad connecting terminal 63 side. Accordingly, even when the semiconductor chip 3 is disposed at a position one-sided to the pad connecting terminal 27 side in the upper surface of the lead integrated island 5, the intervals between the second to fourth pads 66 to 68 and the leads 6 can be prevented from becoming excessively large. Therefore, the wires 70 to 72 to be stretched therebetween can be prevented from becoming excessively long. Consequently, the wires 70 to 72 can be satisfactorily stretched, and an increase in the cost (material cost) of the wires 70 to 72 can be suppressed.

As shown in FIG. 1, the semiconductor chip 3 is disposed so that its part overlaps the pad connecting terminal 27 in a plan view. Accordingly, the semiconductor chip 3 can be increased in size to the pad connecting terminal 27 side. Even when the semiconductor chip 3 is increased in size to the pad connecting terminal 27 side, the intervals between the semiconductor chip 3 and the leads 6 are unchanged, so that it is not necessary to keep the leads 6 away from the lead integrated island 5. Therefore, a large-sized semiconductor chip 3 can be realized without increasing the plane area of the resin package 4, and the wires 70 to 72 can be satisfactorily stretched between the second to fourth pads 66 to 68 and the leads 6, respectively.

Moreover, the semiconductor chip 3 has the parts 64A, 64B protruding from the lead integrated island 5 in a plan view. In the first lead 6, the upper surface of the trapezoidal part 36 opposed to the protruding part 64A is formed lower by one step than the upper surfaces of the other parts 37, 38. Accordingly, contact of the protruding part 64A with the upper surface of the first lead 6 can be reliably prevented.

Also, in the second lead 6, the upper surface of a part opposed to the part 64B protruding from the lead integrated island 5 of the semiconductor chip 3 may be formed lower than the upper surfaces of the other parts. In this case, contact of the protruding part 64B with the upper surface of the second lead 6 can be reliably prevented.

Moreover, the semiconductor chip 3 is formed in a square shape in a plan view, and is disposed so that its side surfaces are parallel with the side surfaces of the resin package 4. Accordingly, two alignment marks (not shown) to recognize the positions of the three pads 65 to 68 of the semiconductor chip 3 on the lead integrated island 5 can be formed on a diagonal of the front surface of the semiconductor chip 3. Therefore, a large interval can be secured between the two alignment marks, so that the positions of the pads 65 to 68 of the semiconductor chip 3 can be recognized with high accuracy. Consequently, the positions of the pads 65 to 68 on the lead integrated island 5 can be positioned with high accuracy.

Moreover, in the lead integrated island 5, the cut-away portion 13 having the straight part 12 and the cut-away portion 15 having the straight part 14 extending in a direction perpendicular to the straight part 12 are formed. Therefore, as a result of the semiconductor chip 3 being disposed on the upper surface of the lead integrated island 5 with reference to the two straight parts 12, 14 so that end edges of the semiconductor chip 3 overlap the straight parts 12, 14, the semiconductor chip 3 can be easily positioned, on the lead integrated island 5, in two directions perpendicular to the straight parts 12, 14.

Moreover, the recess portions 40, 51, 62 are formed in the three leads 6, respectively, and the resin package 4 enters in these recess portions 40, 51, 62. Therefore, the parts of the leads 6 where the recess portions 40, 51, 62 are formed are sandwiched from both sides in its thickness direction by the resin package 4. Thus, the leads 6 can be prevented from dropping out of the resin package 4.

In the above, a description has been given of an embodiment of the present invention, but the present invention can also be carried out in other modes.

For example, the wire 69 may not necessarily be stretched between the first pad 65 and the lead integrated island 5. In this case, since electrical connection between the first pad 65 and the pad connecting terminal 27 is not achieved, the pad connecting terminal 27 serves as a dummy terminal not contributing to electrical connection with the first pad 65.

The shape of the recess portions 40, 51, 62 is not limited to a semicircular shape in a plan view, and may be, for example, an N polygonal shape in a plan view (N≥3).

Although the embodiments of the present invention have been described in detail, these are merely specific examples used to clarify the technical contents of the present invention, and the present invention should not be interpreted as being limited to only these specific examples, and the spirit and scope of the present invention shall be limited only by the accompanying claims.

Moreover, the components mentioned in the embodiments of the present invention can be combined in the scope of the present invention.

The present application corresponds to Japanese Patent Application No. 2009-118833 filed on May 15, 2009 in the Japan Patent Office, and the entire disclosure of this application is herein incorporated by reference.

REFERENCE SIGNS LIST

1: Semiconductor device, 3: Semiconductor chip, 4: Resin package, 5: Lead integrated island, 6: Lead, 12: Straight part, 13: Cut-away portion, 14: Straight part, 15: Cut-away portion, 19: Back connecting terminal, 26: Recess portion, 27: Pad connecting terminal (first pad connecting terminal), 36: Trapezoidal part, 40: Recess portion, 41: Pad connecting terminal (second pad connecting terminal), 51: Recess portion, 52: Pad connecting terminal (second pad connecting terminal), 62: Recess portion, 63: Pad connecting terminal (second pad connecting terminal), 64A: Corner portion (protruding part), 64B: Corner portion (protruding part), 65: First pad (first pad), 66: Second pad (second pad), 67: Third pad (second pad), 68: Fourth pad (second pad), 69: Wire, 70: Wire, 71: Wire, 72: Wire, 73: Groove

What is claimed is:

1. A semiconductor device comprising:
   a resin package;
   a semiconductor chip sealed in the resin package, and having first and second pads on a front surface;
   an island with a projecting terminal, sealed in the resin package, to one surface of which a back surface of the semiconductor chip is bonded, and another surface of which is partially exposed from a bottom surface of the resin package as a first terminal; and
   a lead formed separately from the island with the projecting terminal, sealed in the resin package, one surface of the lead being electrically connected with the second pad, and another surface of which being exposed from the bottom surface of the resin package as a second terminal capable of providing electrical connection between the second pad and outside, wherein
   a center of mass of the semiconductor chip is away from a center of the resin package and the projecting terminal is equally as large as the lead.

2. The semiconductor device according to claim 1, further comprising a connecting member electrically connecting the lead with a second pad.

3. The semiconductor device according to claim 1, wherein a groove is formed in the one surface of the island with the projecting terminal.

4. The semiconductor device according to claim 1, wherein the first and second pads are, in the front surface of the semiconductor chip, disposed closer to a side opposite a first terminal side than to the first terminal side.

5. The semiconductor device according to claim 1, wherein the semiconductor chip is disposed so that a part thereof overlaps the first terminal in a plan view.

6. The semiconductor device according to claim 1, wherein
   the resin package is formed in a square shape in a plan view, and
   the projecting terminal is disposed at an end portion of one side of the square-shaped resin package.

7. The semiconductor device according to claim 1, wherein
   the resin package is formed in a square shape in a plan view,
   the projecting terminal and the lead are arranged as terminal groups along one side of the square-shaped resin package, and
   the projecting terminal is disposed as an end terminal of the terminal groups in a direction along the one side of the square-shaped resin package.

8. A semiconductor device comprising:
   a resin package formed in a square shape in a plan view so that a bottom surface thereof has four corners;
   a semiconductor chip sealed in the resin package, and having first and second pads on a front surface;
   an island with a projecting terminal, sealed in the resin package, to one surface of which a back surface of the semiconductor chip is bonded, and another surface of which is partially exposed from a bottom surface of the resin package as a first terminal disposed at one of the four corners; and
   three leads formed separately from the island with the projecting terminal, one each at the other three of the four corners of the bottom surface of the resin package, and sealed in the resin package, one surface of each of the three leads being electrically connected with the second pads, and another surface of each of the three leads being exposed from the bottom surface of the resin package as three second terminals capable of providing electrical connection between the second pads and outside, wherein
   a center of mass of the semiconductor chip is away from a center of the resin package and the projecting terminal is equally as large as each of the three leads.

9. A semiconductor device comprising:
   a resin package having a front surface and a side surface;
   a semiconductor chip sealed in the resin package, and having first and second pads on a front surface of the semiconductor chip;
   a lead integrated island sealed in the resin package, the lead integrated island having one surface to which a back surface of the semiconductor chip is bonded, and having another surface on an opposite side to the one surface, the other surface of the lead integrated island being partially exposed from a bottom surface of the resin package as a first pad connecting terminal; and
   a lead formed separately from the lead integrated island, sealed in the resin package, one surface of the lead being electrically connected with the second pad, and another surface of the lead on an opposite side to the one surface of the lead being exposed from the bottom surface of the resin package as a second pad connecting terminal capable of providing electrical connection between the second pad and outside, wherein
   the lead is formed inside of the side surface of the resin package.

10. The semiconductor device according to claim 9, wherein the lead integrated island has a projecting portion which has a side part opposite to the lead and formed inside of the resin package.

11. The semiconductor device according to claim 9, wherein the lead integrated island has a recess portion which is located opposite to the lead.

12. The semiconductor device according to claim 9, wherein a center of mass of the semiconductor chip is away from a center of the resin package.

13. The semiconductor device according to claim 9, wherein the first pad is connected to the lead integrated island.

14. A semiconductor device comprising:
   a resin package having a front surface and a side surface;
   a semiconductor chip sealed in the resin package, and having first and second pads on a front surface of the semiconductor chip;
   a lead integrated island sealed in the resin package, the lead integrated island having one surface to which a back surface of the semiconductor chip is bonded, and having another surface on an opposite side to the one surface, the other surface of the lead integrated island having an exposed portion exposed from a bottom surface of the resin package, and an inside portion surrounded by the resin package; and
   a lead formed separately from the lead integrated island, sealed in the resin package, one surface of the lead being electrically connected with the second pad, and another surface of the lead on an opposite side to the one surface of the lead being exposed from the bottom surface of the resin package as a second pad connecting terminal capable of providing electrical connection between the second pad and outside, wherein
   an exposed portion of the lead integrated island is exposed continuously from the bottom surface of the resin package, and the lead is formed inside of the side surface of the resin package.

15. The semiconductor device according to claim 14, wherein the lead has an exposed portion exposed from the bottom surface of the resin package, and an inside portion surrounded by the resin package.

16. The semiconductor device according to claim 14, wherein the lead is formed in a first side of the lead integrated island and in a second side of the lead integrated island opposite to the first side of the lead integrated island.

17. The semiconductor device according to claim 14, wherein the lead integrated island has a recess portion which is located opposite to the lead.

18. The semiconductor device according to claim 14, wherein a center of mass of the semiconductor chip is away from a center of the resin package.

19. The semiconductor device according to claim 14, wherein an end portion of the lead integrated island is formed more thinly than a center portion of the lead integrated island.

20. A semiconductor device comprising:
    a resin package having a front surface and a side surface;
    a semiconductor chip sealed in the resin package, and having first and second pads on a front surface of the semiconductor chip;
    a lead integrated island sealed in the resin package, the lead integrated island having one surface to which a back surface of the semiconductor chip is bonded, and having another surface on an opposite side to the one surface, the other surface having an exposed portion exposed from a bottom surface of the resin package, and an inside portion surrounded by the resin package; and
    a lead formed separately from the lead integrated island, sealed in the resin package, one surface of the lead being electrically connected with the second pad, and another surface of the lead on an opposite side to the one surface of the lead being exposed from the bottom surface of the resin package as a second pad connecting terminal capable of providing electrical connection between the second pad and outside, wherein
    the semiconductor chip is located across the exposed portion and the inside portion and partially projects from the lead integrated island in a plan view, and
    wherein the lead is formed inside of the side surface of the resin package.

21. The semiconductor device according to claim 20, wherein the lead integrated island has a recess portion which is located opposite to the lead.

22. The semiconductor device according to claim 20, wherein a center of mass of the semiconductor chip is away from a center of the resin package.

23. The semiconductor device according to claim 20, wherein a groove is formed in the one surface of the lead integrated island.

24. The semiconductor device according to claim 20, wherein an end portion of the lead integrated island is formed more thinly than a center portion of the lead integrated island.

* * * * *